(12) United States Patent
Fan et al.

(10) Patent No.: US 10,816,606 B2
(45) Date of Patent: Oct. 27, 2020

(54) METHOD AND SYSTEM FOR NOISE-TOLERANT RC RESPONSE PREDICTION

(71) Applicant: GM Global Technology Operations LLC, Detroit, MI (US)

(72) Inventors: Yue Fan, Annn Arbor, MI (US); Russell K. Steele, Clinton Township, MI (US); Andrew C. Baughman, Northville, MI (US); Peter Kung Chiang, Carmel, IN (US)

(73) Assignee: GM Global Technology Operations LLC, Detroit, MI (US)

( * ) Notice: Subject to any disclaimer, the term of this patent is extended or adjusted under 35 U.S.C. 154(b) by 121 days.

(21) Appl. No.: 16/239,188

(22) Filed: Jan. 3, 2019

(65) Prior Publication Data

US 2020/0217899 A1 Jul. 9, 2020

(51) Int. Cl.
| | | |
|---|---|---|
| *G01R 31/389* | (2019.01) | |
| *B60L 58/12* | (2019.01) | |
| *G01R 31/00* | (2006.01) | |
| *G01R 31/367* | (2019.01) | |
| *B60L 58/14* | (2019.01) | |
| *H02J 7/00* | (2006.01) | |
| *H02P 27/06* | (2006.01) | |

(52) U.S. Cl.
CPC ............ *G01R 31/389* (2019.01); *B60L 58/12* (2019.02); *B60L 58/14* (2019.02); *G01R 31/007* (2013.01); *G01R 31/367* (2019.01); *H02J 7/00* (2013.01); *H02P 27/06* (2013.01)

(58) Field of Classification Search
CPC .. G01R 31/389; G01R 31/367; G01R 31/007; G01R 31/2837; B60L 58/12; B60L 58/14; H02J 7/00
USPC ........................................................ 307/10.1
See application file for complete search history.

(56) References Cited

U.S. PATENT DOCUMENTS

| | | | |
|---|---|---|---|
| 2012/0095709 A1* | 4/2012 | Smith ..................... | G01R 31/50 702/65 |
| 2020/0110454 A1* | 4/2020 | Yang ........................ | G06N 3/08 |

\* cited by examiner

*Primary Examiner* — Michael R. Fin
(74) *Attorney, Agent, or Firm* — Quinn IP Law (57) ABSTRACT

An electrical system includes a voltage bus, voltage sensor (s) measuring a first voltage between a positive bus rail and electrical ground, and a second voltage between a negative bus rail and electrical ground, a bias resistor, and a controller. When the switch is closed, the controller measures four or more discrete voltage samples of the first and second voltages. The samples are grouped into first and second sample groups each having three discrete voltage samples, with the second and third voltage samples of the first group being the first and second samples of the second group. The controller estimates a steady-state voltage of the first and second voltages using the sample groups, prior to the first and second voltages converging on actual steady-state voltage values. The controller executes a corresponding control action when the steady-state voltage estimate is stable or unstable relative to a defined stability threshold.

18 Claims, 3 Drawing Sheets

METHOD AND SYSTEM FOR NOISE-TOLERANT RC RESPONSE PREDICTION

INTRODUCTION

Electric powertrains, power plants, and other systems often employ separate high-voltage and low-voltage buses. The low-voltage bus may provide a maximum voltage level of 12-15 volts, with such a voltage level commonly referred to as an auxiliary voltage. The term "high-voltage" in a dual-bus electrical system describes voltage levels well in excess of auxiliary levels, e.g., 60-300 volts or more for an electric propulsion system. The high-voltage voltage bus is connected to a rechargeable energy storage system (RESS), such as a multi-cell lithium ion or nickel metal hydride battery pack and associated power electronics. The low-voltage bus may be connected to an application-suitable auxiliary battery, for instance a lead-acid battery. On the high-voltage bus, strategically-positioned fuses and electrical switches enable rapid disconnection of the RESS from the high-voltage bus in the event of an electrical fault, with the switches also commanded to open during routine shut down operations.

As an added precaution, the high-voltage bus may be isolated from electrical ground by interposing a threshold isolation resistance. In vehicle applications, a vehicle chassis serves as electrical ground for the onboard electrical system, and therefore the chassis is commonly referred to as a chassis-ground. A controller may consider the resistance of the electrical system when making various control decisions. For example, the controller may be programmed to determine whether circuit resistance is sufficiently high for conducting a particular operation, e.g., DC fast-charging of the RESS.

SUMMARY

An electrical system is disclosed herein that includes a rechargeable energy storage system (RESS) connected to a voltage bus. The controller is programmed to determine an RC response of the electrical circuit when estimating a steady-state voltage level of the voltage bus, and to use the response to determine whether the estimated steady-state voltages are sufficiently stable relative to a stability threshold. If stable, the controller executes a control action that changes the logical and/or dynamical state of the electrical system. If insufficiently stable, the controller collects more data samples according to the disclosed method, estimates the steady-state voltages again, and then makes another stability determination. The RC response of the circuit is thus useful for deriving a corresponding circuit resistance, for example an isolation resistance in a possible loss-of-isolation detection strategy, with the RC response also being useful in other applications or systems exhibiting an RC response, e.g., thermal systems, in which detailed knowledge of the circuit resistance is beneficial.

The controller disclosed herein automatically switches in a bias resistor via operation of a switch, doing so responsive to a trigger signal, and then periodically measures bus rail voltages at a calibrated sampling interval, i.e., a first voltage between a positive rail of the voltage bus and electrical ground, and a second voltage between the negative rail of the voltage bus and the electrical ground.

The controller collects sample sets of the first and second voltages after switching in the bias resistor. Using the sampled voltages, the controller estimates the steady-state voltages assuming the RC response in the electrical circuit. In this manner, the controller uses the estimated steady-state voltages, once the estimates are sufficiently stable, to more rapidly determine information such as a resistance of the electrical circuit, rather than waiting for the bus rail voltages to fully stabilize at their respective actual steady-state voltages. As will be appreciated by those of ordinary skill in the art, waiting for bus rail voltages to reach their respective actual steady-state values may, in certain electrical systems, require 20-30 seconds or more of total elapsed time. Such a duration can unduly delay onset of a controlled process, with a DC fast-charging process being an example of such a process.

The present approach is intended to be highly robust to signal noise, and thus may be used to advantage in noisy environments. The controller may account for signal noise by running multiple additional iterations of the present method, with each iteration possibly extending the sampling interval by a calibrated multiple, and also reusing some of the earlier voltage samples, which in turn minimizes the required time for subsequent iterations. With each subsequent iteration, the controller uses different sample triplets (or more samples) that are more spread out in time. Efficient RC response prediction using the present method may be further enhanced via determination of a maturation threshold and/or pseudorandom timing of the sampling intervals. A desired end goal of the present strategy is faster derivation of the estimated steady-state voltages after the trigger event, with exemplary beneficial applications including improved/earlier voltage isolation detection and mitigation against system noise/false readings.

In an example embodiment, an electrical system is described herein having a voltage bus with positive and negative bus rails, an RESS connected to the voltage bus, and an electrical circuit connected to the RESS via the voltage bus. The circuit also includes one or more voltage sensors configured to measure a first voltage between the positive bus rail and electrical ground, and a second voltage between the negative bus rail and the electrical ground. A bias resistor is connectable to electrical ground and to the voltage bus via a switch. The switch, when it is in a closed state, electrically connects the bias resistor to one side of the voltage bus.

As part of the example electrical system, a controller closes the switch responsive to a trigger signal, measures at least five voltage samples of the first and second voltages (bus rail voltages) at a calibrated sampling interval, estimates steady-state voltages of the electric circuit based on an RC response of the electrical circuit, and uses the voltage samples, prior to the first and second voltages converging on respective actual steady-state voltages, to execute a control action of the electrical system. That is, when a trend of the RC response is indicative of the first and second voltages being sufficiently stable relative to within an allowable tolerance/threshold, the controller registers the estimated values as sufficiently stable and thereafter makes control decisions using such estimated values.

The control action may include initiating a loss-of-isolation detection function, and if a loss-of-isolation fault is not detected, initiating a DC fast-charging operation of the RESS.

When a time-out value has not been reached, or when stability is not otherwise present, the controller may optionally measure two or more additional samples of the first and second voltages at a multiple of the calibrated sampling interval, doing so responsive to the trend being unstable relative to the allowable stability threshold. The controller may then re-derive the steady-state voltage estimates using the various voltage samples.

The trend in the RC response/estimated RC steady-state voltages, may be indicative of a steady-state voltage estimate differing from another steady-state voltage by more or less than a calibrated threshold, or the trend may be indicative of a predetermined standard deviation of the steady-state voltage estimates differing from a calibrated standard deviation, or from each other.

The electrical system may include a power inverter module connected to the high-voltage bus and an electric machine connected to the power inverter module, with the electric machine being coupled to a driven load. The electric machine may be embodied as a traction motor and the driven load as set of road wheels of a vehicle.

A method for predicting steady-state voltage of an electrical circuit using its RC response is also disclosed. In an embodiment, the method includes, responsive to a trigger signal, connecting a bias resistor to the voltage bus via activation of a switch by a controller. After the switch closes, the method includes measuring four or more discrete voltage samples of each of the first and second voltages via the voltage sensor(s) at a calibrated sampling interval, as the first voltage and the second voltage converge on a respective actual steady-state voltage.

The method includes estimating steady-state voltage values of the electric circuit, via the controller, based on the RC response of the electrical circuit, doing so using the voltage samples prior to the first and second voltages converging on the respective actual steady-state voltages. The method thereafter includes executing a corresponding control action when a trend of the RC response/steady-state voltages is indicative of the first and second voltages being sufficiently stable relative to an allowable tolerance or threshold.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

Figure 1:
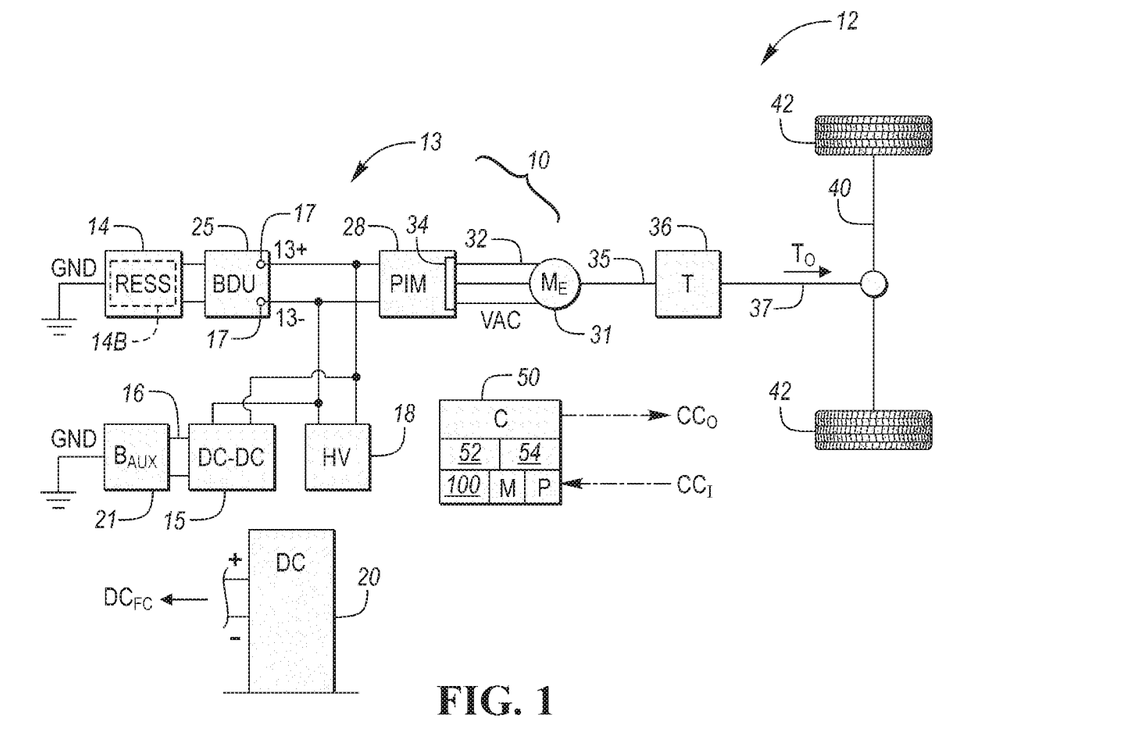
FIG. 1 is a schematic illustration of an example vehicle having an electrical system that includes a rechargeable energy storage system (RESS), a high-voltage bus, a connected high-voltage component, and a controller programmed to perform the present method to derive circuit resistance via derivation and use of an RC response as described herein.

Referring to the drawings, wherein like reference numbers refer to like components, FIG. 1 depicts an electrical system 10 having a high-voltage bus 13 and a rechargeable energy storage system (RESS) 14. A DC-DC converter 15 may be electrically connected to the HV bus 13 and configured to output an auxiliary voltage on a low-voltage bus 16, with an auxiliary battery ($B_{AUX}$) 21 connected to the low-voltage bus 16 as shown. In some embodiments, the terms "high-voltage" and "low-voltage" may encompass voltage levels of 60-volts or more (high-voltage) and less than 12-15 volts (low-voltage), with high-voltage levels possibly exceeding 300-volts. The RESS 14 may include a multi-cell rechargeable battery pack 14B having a lithium-ion, nickel metal hydride, or other application-suitable battery cell chemistry, as well as associated power electronics required for proper control and thermal regulation of such battery cells.

The electrical system 10 of FIG. 1 may be used as part of an example vehicle 12 in a non-limiting example embodiment, or may be used as part of a power plant or other mobile or stationary system. For illustrative consistency, the vehicle 12 of FIG. 1 will be used herein without limitation. A controller 50, the function of which is described in detail below with reference to FIGS. 2-6C, may be programmed with an equivalent circuit model 52 of the electrical system 10. As part of a computer-executable method 100, the controller 50 may automatically switch in a bias resistor 54, which is labeled ($R_B$) in FIG. 2, and periodically use one or more voltage sensors 17 to measure a voltage between a positive bus rail 13+ of the high-voltage bus 13 and electrical ground/chassis-ground (GND). The controller 50 also measures the voltage between a negative bus rail 13− of the high-voltage bus 13 and chassis-ground (GND), with such voltages referred to below as first and second voltages V1 and V2 and respectively illustrated in FIGS. 3A and 3B.

Figure 2:
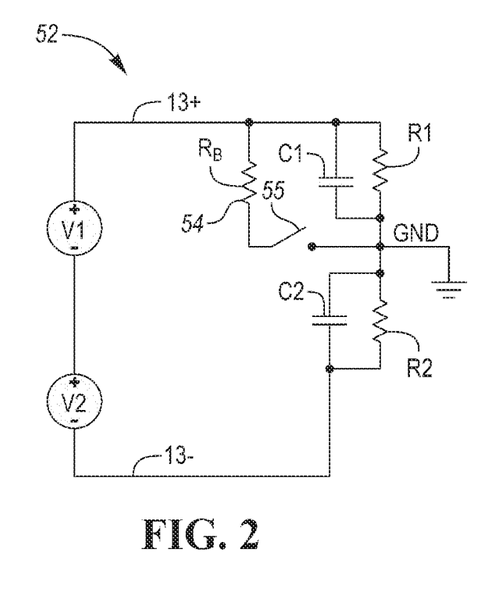
FIG. 2 is a schematic illustration of an equivalent RC circuit for a portion of the electrical system depicted in FIG. 1.

In executing the method 100, the controller 50 estimates the RC steady-state voltages of the bus rails 13+ and 13− over time, as represented in a circuit model 52, doing so with the bias resistor 54 switched in while the measured voltages have not yet reached their corresponding actual steady-state values. The controller 50, when executing the method 100, thus estimates the RC steady-state voltages responsive to a predetermined request in the form of a suitable trigger signal. In an exemplary embodiment, the predetermined trigger signal may be an automated request for active isolation detection of the high-voltage bus 13 from the chassis ground (GND), e.g., prior to conducting a DC fast-charging operation of the RESS 14, with other embodiments also benefitting from early determination of an equivalent resistance of the electrical system 10 being possible. In this manner, the controller 50 is able to more rapidly determine the equivalent resistance of the various electrical components and structure connected to the RESS 14 at an earlier time point relative to waiting for the above-noted voltages to fully stabilize, with the method 100 being robust to signal noise via the option of additional iterations of the method.

The controller 50 shown schematically in FIG. 1 may be embodied as one or more low-voltage digital computers having a processor (P), e.g., a microprocessor or central processing unit, as well as memory (M) in the form of read only memory, random access memory, electrically-programmable read only memory, etc., a high-speed clock, analog-to-digital and digital-to-analog circuitry, input/output circuitry and devices, and appropriate signal conditioning and buffering circuitry. In some embodiments, the controller 50 may be a battery system manager, the functions of which may vary with the intended application, but possibly including monitoring and controlling temperature, state of charge, voltage, and other performance characteristics of the RESS 14.

Still referring to FIG. 1, one or more high-voltage (HV) components 18 may be electrically connected to the RESS 14 via the high-voltage bus 13. In turn, the RESS 14 may be electrically connected to the high-voltage bus 13 via a battery disconnect unit (BDU) 25. Within the BDU 25 or another suitable location on the high-voltage bus 13, voltage sensors ($V_S$) 17 measure and report the voltages between the chassis ground (GND) and the respective positive and negative bus rails $13^+$ and $13^-$, as noted above, doing so as part of a set of input signals (arrow $CC_I$) to the controller 50.

Although omitted for simplicity from FIG. 1, the BDU 25 also includes high-voltage switching devices such as solenoid-driven contactors, solid-state/semiconductor switches, and/or other suitable switching devices, a pre-charge resistor, and other components for electrically connecting the RESS 14 to the remainder of the electrical system 10. Responsive to the input signals (arrow $CC_I$), the controller 50 may output control signals (arrow $CC_O$) to the electrical system 10 to ultimately change a logic and/or operating state/dynamical state of the electrical system 10, such as by registering a value indicative of the stability of the RC response, commanding operation of the BDU 25 to connect or disconnect the BDU 25 via the above-noted switching operation, and/or commence a charging operation of the RESS 14 via a DC charging voltage (arrow $DC_{FC}$) via an offboard DC fast-charging station 20.

Additionally, the example electrical system 10 may optionally include a power inverter module (PIM) 28 that is electrically connected to a polyphase electric machine ($M_E$) 31, e.g., an electric traction motor as shown or an electric generator in other embodiments, via an alternating current (VAC) voltage bus 32. When energized, the electric machine 31 outputs motor torque to drive an input member 35 of a coupled driven load, e.g., transmission (T) 36. Output torque (arrow $T_O$) is then transmitted from an output shaft 37 of the transmission 36 to one or more drive axles 40, and ultimately to a set of road wheels 42 in the illustrated vehicle 12. As will be appreciated by those of ordinary skill in the art, the PIM 28 includes semiconductor switches 34, e.g., a bank of IGBTs or other application-suitable shown collectively and schematically for simplicity. The semiconductor switches 34 have a corresponding on/off (conducting/non-conducting) switching states that may be controlled responsive to switching signals from the controller 50. The switching control signals may be used for power inversion or conversion as needed.

Figure 3A:
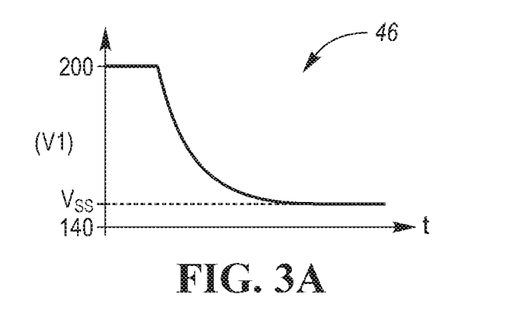
FIGS. 3A and 3B are plots of voltage (vertical axis) versus time (horizontal axis) after switch-in of a bias resistor into the circuit of FIG. 2.
Figure 3B:
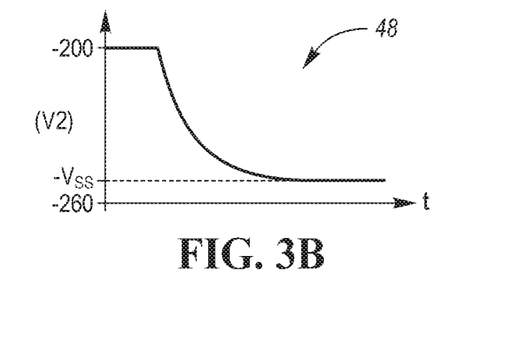

FIG. 2 depicts the circuit model 52 representing a portion of the electrical system 10 shown in FIG. 1, i.e., an equivalent RC circuit of isolation-relevant components connected to the RESS 14. Additionally, the bias resistor ($R_B$) 54 is depicted along with a switch 55, with the switch 55 shown in an open state. The controller 50 of FIG. 1, responsive to a trigger signal as noted above, switches the bias resistor 54 into the circuit 10 by closing the switch 55. Thereafter, the voltages between chassis-ground (GND) and the respective positive and negative bus rails $13^+$ and $13^-$ are measured and reported to the controller 50, with a first voltage (V1) representing the positive rail $13^+$ measurement and a second voltage (V2) representing the negative rail $13^-$ measurement. The time plots 46 and 48 of FIGS. 3A and 3B represent the stabilization of first and second voltages V1 and V2, respectively, with the first and second voltages V1 and V2 gradually converging on actual steady-state voltages value ($V_{SS}$ or $-V_{SS}$). The indicated trajectory is indicative of the RC response. With no further control actions taken, the first and second voltages V1 and V2 will eventually reach their respective actual steady-state voltages ($V_{SS}$ or $-V_{SS}$), with $V_{SS}$ and $-V_{SS}$ not necessarily having the same absolute voltage.

As will be understood by one of ordinary skill in the art, electrical components connected to the RESS 14 of FIG. 1 via the bus rail $13^+$ collectively exhibit a capacitance (C1) and a resistance (R1) that give rise to the RC response, with an RC time constant being the product of the resistance and capacitance, and a corresponding voltage trend or trajectory, e.g., time plot 46 (FIG. 3A). Likewise, high-voltage components connected to the RESS 14 via the negative bus rail $13^-$ collectively exhibit a capacitance (C2) and a resistance (R2) that give rise to the trajectory of time plot 48 (FIG. 3B). The controller 50 is thus configured to use the RC response as exemplified in time plots 46 and 48 to estimate steady-state voltages and expedite diagnostic decisions and overall performance of tasks depending on such steady-state information, such as active isolation detection. The term "faster" is relative to the amount of time needed for the first and second voltages (V1 and V2) to reach their actual respective steady-state values ($V_{SS}$ and $-V_{SS}$). In turn, expediting determination of the RC response can enable a faster key-on control response, shorter wait times when commencing charging via the example DC fast charging station 20 of FIG. 1, and other possible benefits.

More specifically, the controller 50 shown in FIG. 1 may use a minimum of four discrete voltage samples of each of the first and second voltages V1 and V2 to determine the above-noted RC response. In a first iteration of the method 100, two groups of three such discrete voltage samples, e.g., samples (1, 2, 3) and (2, 3, 4), with 1-4 indicating the sample number in this example, may be used to derive an estimated steady-state voltage. In subsequent iterations, when the estimated steady-state voltage is insufficiently stable relative to a stability threshold, or when the controller 50 is aware beforehand that sampling is conducted in a noisy environment, the controller 50 may add additional discrete voltage samples. Such samples replace noisy data at increased sampling intervals, i.e., multiples of the sampling interval used in the first iteration. Thus, the method 100 is robust and adaptable to signal noise. Variable-length sampling may be used in conjunction with a rationality/pass-fail diagnostic check using various criteria, such as but not limited to standard deviation of the time constants, voltages, equivalent resistance, and/or other values as described below with reference to FIGS. 6A-6C, with optional low-pass filtering of the sampling data in certain embodiments.

Figure 4:
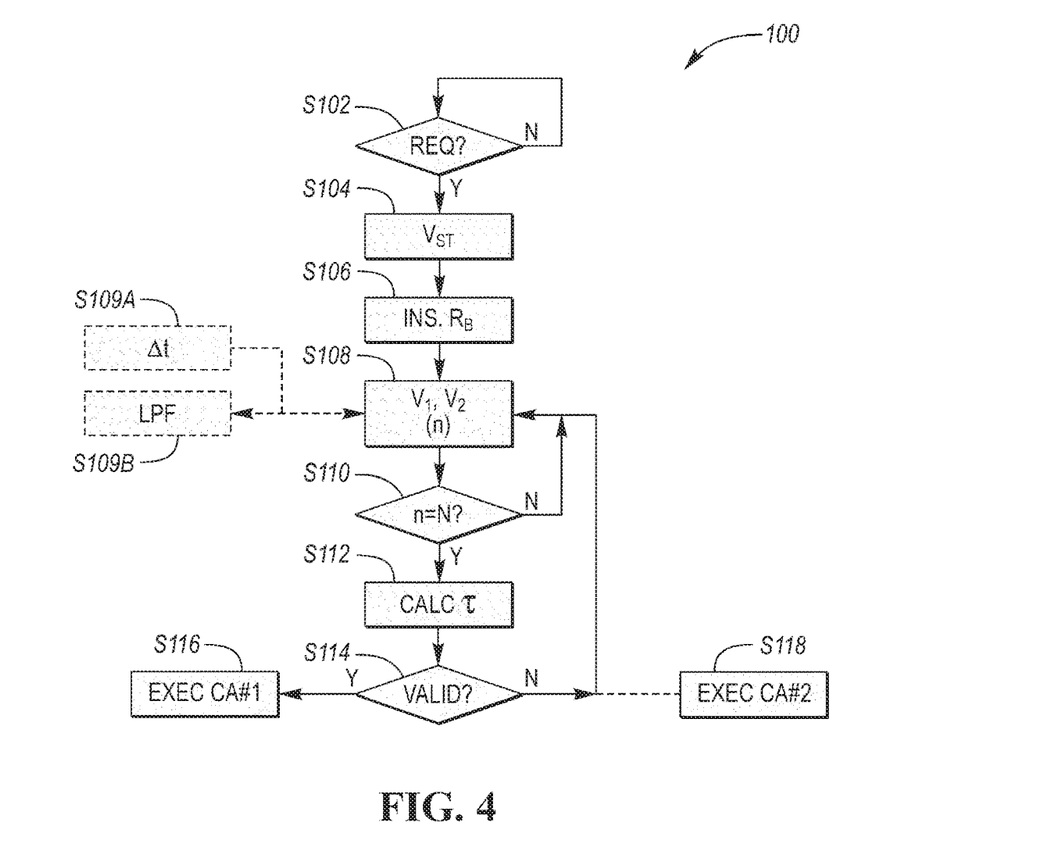
FIG. 4 is a flow chart of an example embodiment of the present method.

Referring to FIG. 4, the method 100 according to an example embodiment commences with step S102. The controller 50 detects an input signal, such as request for sampling ("REQ?") or another automatically-generated trigger signal, e.g., a requested loss of isolation detection prior to conducting a DC fast-charging process. The controller 50 then proceeds to step S104.

Step S104 includes measuring discrete samples of the starting voltages ("$V_{ST}$") of the first and second voltages V1 and V2 with the switch 55 in an open state, i.e., with the bias resistor 54 of FIG. 2 disconnected. Such discrete voltage samples may be temporarily recorded in memory (M) and used to establish the starting point of the voltage trajectories shown in time plots 46 and 48 of FIGS. 3A and 3B, respectively. The method 100 then proceeds to step S106.

At step S106, the controller 50 closes the switch 55 of FIG. 2 responsive to the trigger signal of step S102 to insert the bias resistor 54 ("INS. $R_B$"), thereby connecting the bias resistor 54 to the respective positive or negative rail 13+ and 13−, i.e., only one rail 13+ or 13− is connected at a time in step S106. Method 100 proceeds to step S108.

Step S108 may entail measuring a plurality of discrete voltage samples of the respective first and second voltages V1 and V2 at a calibrated sampling interval, $\Delta t$, with the controller 50 doing so as the first and second voltages V1 and V2 approach a respective actual steady-state voltage level. Step S108 may include collecting three or more discrete voltage samples. Optional steps S109A and S109B may be used as part of the method 100 at this point, with step S109A including selecting the sampling interval ("$\Delta t$") for a first iteration of method 100 and step S109B optionally filtering the sampled data, e.g., using a low-pass filter ("LPF") and/or a data acquisition noise filter. The method 100 then proceeds to step S110.

Step S110 includes comparing the number of voltage samples (n) of step S108 to a calibrated threshold (N), with N=4 in this example embodiment for each of the first and second voltages V1 and V2, and then repeating step S108 if the calibrated number of voltage samples has not yet been measured. The method 100 proceeds to step S112 once the calibrated number of voltage samples has been collected.

At step S112, the controller 50 of FIG. 1 next derives an estimated RC steady-state voltage of the electric circuit 10 using the voltage samples of step S108, prior to the first and second voltages V1 and V2 reaching their actual steady-state voltage levels. As the estimate may apply to other RC values in alternative embodiments, this step is abbreviated "$\tau$" in FIG. 4. The controller 50 may calculate the RC-based steady-state voltages using various approaches, as will be appreciated by those of ordinary skill in the art, for instance as follows:

$$V_C = V_{t1} - \frac{(V_{t1} - V_{t2})^2}{V_1 - 2V_{t2} + V_{t3}}$$

with $V_{t1}$, $V_{t2}$, and $V_{t3}$ being the individual discrete voltage values sampled at t=0, t=$\Delta t$, and t=2$\Delta t$, respectively.

Figure 5:
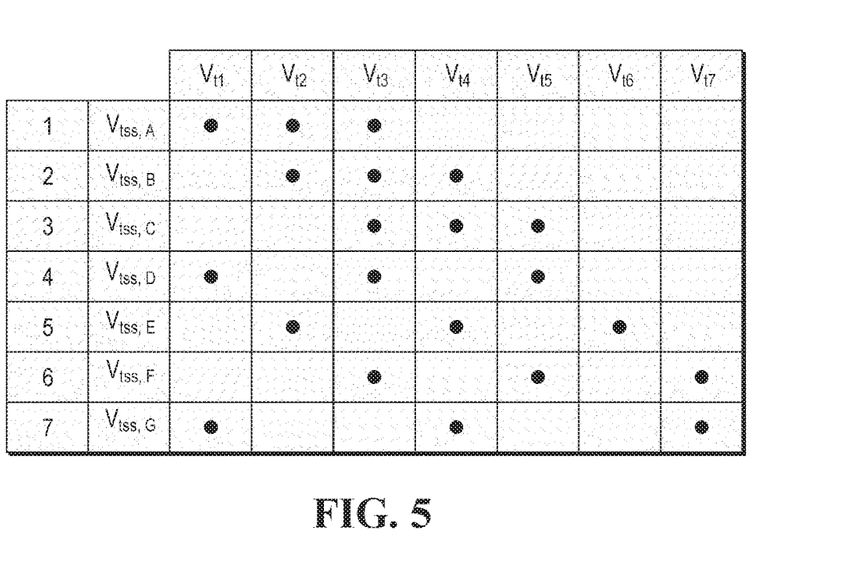
FIG. 5 is a table of representative voltage samples according to the present method.

Referring briefly to FIG. 5, in order to derive the RC steady-state voltages, in a first iteration of method 100 the controller 50 may estimate four steady-state voltages, starting with a first estimated steady-state voltage ($V_{tss,A}$):

$$V_{tss,A} = V_{t1} - \left[\frac{(V_{t1} - V_{t2})^2}{(V_{t1} - 2V_{t2} + V_{t3})}\right].$$

Using five sample sets, $V_{tss,A}$ may be estimated using the first three voltage samples collected at t=$t_1$, t=$t_2$, and t=$t_3$, i.e., $V_{t1}$, $V_{t2}$, and $V_{t3}$, with each sample separated by the sampling interval ($\Delta t$). A second estimated steady-state voltage ($V_{tss,B}$) may be similarly determined using the second, third, and fourth voltage samples, i.e., $V_{t2}$, $V_{t3}$, and $V_{t4}$. Likewise, a third estimated steady-state voltage $V_{tss,C}$ may be calculated using the third, fourth, and fifth voltage samples, i.e., $V_{t3}$, $V_{t4}$, and $V_{t5}$, again retaining the original sampling interval of $\Delta t$. Then, the controller 50 determines a fourth estimated voltage sample $V_{tss,D}$ using the first, third, and fifth voltage samples, effectively doubling the sampling interval from $\Delta t$ to 2$\Delta t$, and then proceeds to step S114. In this example the total number of discrete voltage samples is five, with three discrete voltage samples per sample group, i.e., sample group 1=($V_{t1}$, $V_{t2}$, $V_{t3}$), sample group 2=($V_{t2}$, $V_{t3}$, $V_{t4}$), and sample group 3=($V_{t3}$, $V_{t4}$, $V_{t5}$). Note that in each of the triplets, the first collected sample of the prior group is discarded and a new sample is collected, e.g., in sample group 2, the first sample $V_{t1}$ of sample group 1 is discarded and a new discrete voltage sample $V_{t4}$ is collected, while in group 3, the first sample $V_{t2}$ of sample group 1 is discarded and a new discrete voltage sample $V_{t5}$ is collected.

Referring again to FIG. 4, at step S114 the controller 50 verifies the result of the steady-state voltage estimates by comparing the last steady-state voltage estimate, in this instance $V_{tss,D}$, to the first estimated steady-state voltage $V_{tss,A}$. Step S114 may entail verifying whether the step S112 calculations have sufficiently converged on a result or the trend of the resultant estimated steady-state voltage indicates a stable/valid ("VALID?") result to within a calibratable tolerance for making a control decision, i.e., a stability threshold.

The controller 50 may, for each of the voltage sample sets, evaluate the denominator of the various steady-state calculations to confirm that the denominator has not reached zero or switched its sign. Either result may be sufficient cause for the controller 50 to proceed with executing another iteration of the method 100, in which case the method 100 proceeds to step S118. The method 100 proceeds to step S116 if the results of the calculations are stable/valid.

Step S116 includes executing a first control action ("Exec CA #1") via the controller 50 of the electrical system 10 using the RC steady-state voltage estimates, including recording a code in memory (M) of the controller 50 that is indicative of a sufficiently stable steady-state voltage estimate. Using the steady-state voltage estimates noted above, for instance, and given the various voltages, the controller 50 may calculate and output the equivalent resistance of the various circuit components connected to the RESS 14 of FIG. 1, which in the example high-voltage isolation detection approach corresponds to an isolation resistance value. This value may be compared to a threshold and used by the controller 50 to record a diagnostic code or a corresponding pass/fail bit flag, and/or to command a disconnection of the RESS 14 or disabling charging when the isolation resistance value is too low in the exemplary vehicular embodiment of FIG. 1. Alternatively, the controller 50 may consider a standard deviation of the various estimated steady-state voltages and/or differences of estimated steady-state voltages or other values from successive values as specified below with reference to FIGS. 6A-C. The method 100 is complete and commences anew with step S102.

Step S118 ("Exec CA #2") may include, as a second control action, repeating step S108 as another iteration of method 100. Such a step may coincide with recording an indefinite or indeterminate diagnostic code to prompt execution of another iteration of method 100. Depending on the situation, step S118 may include using the estimated steady-state voltage $V_{tss,D}$ noted above to calculate the circuit resistance, such as if an allotted time has elapsed for determining the resistance and thus no time remains for additional iterations. However, when ample time for performing another iteration of the method 100 remains, step S118 may include collecting two or more additional discrete voltage samples at t=$t_6$ and t=$t_7$, shown in FIG. 5 as $V_{t6}$ and $V_{t7}$, and again re-using the prior-collected voltage samples to derive additional steady-state voltage values at a multiple of the initial sampling interval, e.g., 2Δt, with such values represented in FIG. 5 as $V_{tss,E}$ and $V_{tss,F}$. Thus, with six voltage samples used in the second iteration in this non-limiting exemplary embodiment, the estimated steady-state voltage $V_{tss,E}$ may be calculated using every other voltage sample. This corresponds to the second, fourth, and sixth voltage samples $V_{t2}$, $V_{t4}$, and $V_{t6}$. Similarly, the sixth estimated steady-state voltage $V_{tss,F}$ uses the third, fifth, and seventh voltage samples $V_{t3}$, $V_{t5}$, and $V_{t7}$.

Similar to how $V_{tss,D}$ was calculated in step S112, the seventh steady-state voltage $V_{tss,G}$ is calculated at a sampling interval of 3Δt by skipping every two intervening samples and using the first, fourth, and seventh samples $V_{t1}$, $V_{t4}$, and $V_{t7}$. Subsequent iterations, if needed based on the stability decision, could skip every three intervening samples, and so forth. As with the first iteration, the steady-state voltage $V_{tss,G}$ is compared back to the first calculation of the second iteration, in this instance $V_{tss,D}$, with the controller 50 thereafter proceeding to check the validity of the result in the manner described above with reference to step S114.

Thus, method 100 uses previously-collected samples from the first iteration in conjunction with new voltage samples in subsequent iterations, doing so at a progressively decreasing sampling rate. Such an approach should result in quicker useful estimation of the RC response in low-noise environments while still minimizing overall process time when sampling in high-noise environments. Additional iterations may be used in very noisy environments, e.g., using 3Δt, 4Δt, etc., as necessary to achieve a sufficiently stable value upon which to base a subsequent control action.

Figure 6A:
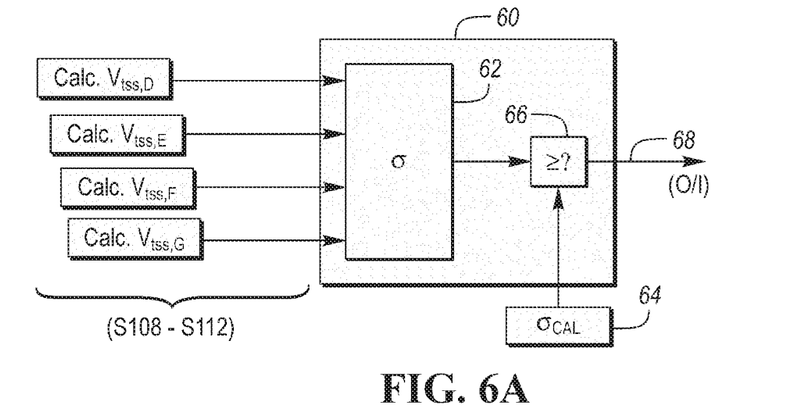
FIGS. 6A-C are possible alternative example embodiments of a logic block usable as part of the disclosed method.
Figure 6B:
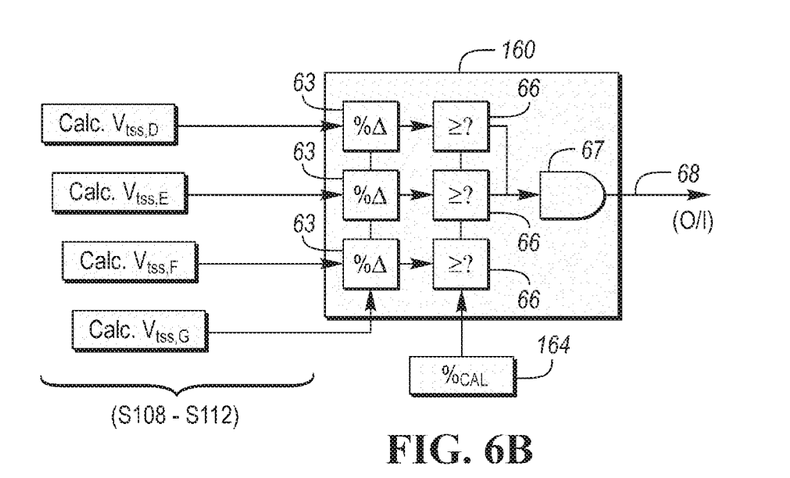
Figure 6C:
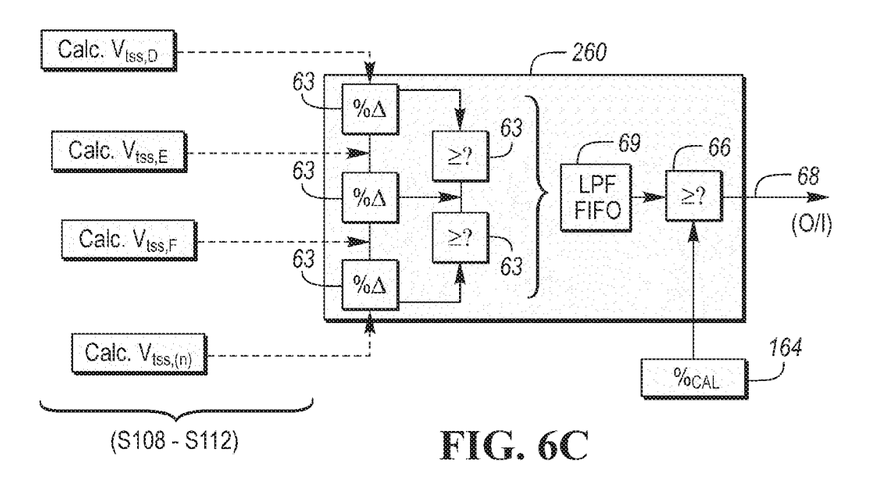

FIGS. 6A, 6B, and 6C depict three possible embodiments for using the results of the above-described calculations of steps S108-S112, e.g., the underlying RC steady-state voltage ($V_{SS}$) derived from the various estimates $V_{tss,D}$, $V_{tss,E}$, and $V_{tss,F}$ at the sampling interval of Δt and $V_{tss,G}$ at the sampling rate of (x+1)Δt, e.g., 2Δt, in making a control decision with respect to the electrical system 10 of FIG. 1. Various standards may be used to make such a decision, and therefore a decision block 60 may be implemented for this purpose.

In a possible embodiment, the decision block 60 may use a standard deviation (σ) calculation block 62 to derive the standard deviation of the various RC steady-state voltage estimates, i.e., $V_{tss,A}$, $V_{tss,B}$, $V_{tss,C}$, $V_{tss,D}$, depending on the number of iterations of method 100. The standard deviation may be compared to a calibrated standard deviation (σCAL) from block 64. If the standard deviation equals or exceeds the calibrated standard deviation, the controller 50 may output a corresponding diagnostic code (arrow 68), e.g., a binary (0/1) bit flag indicative of the level of convergence indicated by the comparison result. For instance, a binary value of 0 may indicate an insufficiently settled or stabilized result and a binary value of 1 may indicate a sufficiently stabilized result. The stabilized value itself may thereafter be used in a threshold diagnostic decision, as noted above, while an insufficiently stabilized value may prompt another iteration of method 100. Note that using the method 100, actual steady-state is not required, but rather the trends of the RC time constant or derived values is used to expedite related diagnostic actions and control actions.

FIG. 6B illustrates an alternative decision block 160 in which the standard deviation calculation block 62 of FIG. 6A is replaced with individual deviation calculation blocks 63. Here, trends in the form of a percentage difference ("% Δ") between a given RC steady-state voltage estimate and a next subsequent RC steady-state voltage estimate are determined, $$e.g., \frac{V_{tss,A} - V_{2tss,B}}{V_{tss,A}} \times 100\%.$$

A threshold percentage difference may be fed into the comparison blocks 66 by block 164, with the results of the comparison blocks 66 in turn feeding an optional AND logic gate 67. Thus, if the trends in RC time constants indicated by the voltage trajectories of FIGS. 3A and 3B is sufficient for converging on a steady-state value within an allotted time, the diagnostic code (arrow 68) may indicate such a result, or the contrary result may be indicated if one or more of the threshold comparisons conducted at block 66 indicates an insufficiently stabilized value.

Yet another possible implementation is shown in FIG. 6C. Similar to the embodiment of FIG. 6B, the implementation of FIG. 6C uses the deviation calculation blocks 63, but rather than feeding results into the AND logic gate 67 of FIG. 6B, a decision block 260 also calculates the difference between the individual difference values to ascertain trends. An optional low-pass filter of first-in, first-out values (LPF FIFO) 69 may then feed values into a single comparison block 66, with the decision block 260 of FIG. 6C ultimately outputting a value of 1 or 0, respectively, or a corresponding diagnostic code depending on the result of the comparison. Once again, the method 100 may proceed to use the stabilized value in a diagnostic control decision, once RC response trends are properly analyzed using the above-described strategy, while data that has not converged on a result may be handled by another iteration of the method 100.

Those of ordinary skill in the art will appreciate that other embodiments may be used to make similar determinations of the relative stability of the steady-state voltage estimates depending on the application, including comparing resistance values to calibrated resistances, or even combining the results of FIGS. 6A, 6B, and 6C. For instance, while one could use an absolute standard deviation as a threshold, in some embodiments it may be possible to output a passing or failing result based on the trajectory or other values even if the standard deviation is higher than such a threshold.

FIGS. 1-6C collectively illustrate possible strategies for verifying and predicting an RC value, e.g., steady-state voltages, using the RC response in an electrical circuit such as the example electrical circuit 10 of FIG. 1. In executing the method 100 of FIG. 4, the controller 50 is able, using discrete voltage samples for each bus rail 13$^+$ and 13$^-$ and adding more discrete samples at multiples of a sampling interval as needed to account for noisy data, to extrapolate the RC response. The controller 50 may use dynamic variation of the sample intervals for added noise tolerance. The approach may be modified as desired, e.g., using different standards such as standard deviation of the RC time constant, resistance, voltage decay trends, low-pass filtering of sampled voltages, etc.

Subsequent control actions may be executed using the steady-state voltage estimates when a trend of the derived RC response is indicative of the rail voltages being sufficiently stable relative to an allowable tolerance or threshold. The various embodiments detailed herein thus enable faster resolution of certain control problems, such as but not limited to active high-voltage loss-of-isolation detection prior to a DC fast-charging operation, with such a function indicating whether or not a high-voltage isolation fault is present.

Those of ordinary skill in the art will appreciate that the present teachings, while presented in terms of derivation of steady-state voltages in an example application, may be extended to other systems exhibiting a similar RC response, e.g., thermal systems such as a heating module. In such an example, the heating module can be controlled to output a certain amount of power to reach a desired temperature when needed. Reaching the desired temperature too early tends to waste energy or put more thermal stress on components of the heating module due to differences in thermal expansion coefficients and thermal gradients. Conversely, achieving the desired temperature too late can inconvenience the user. The present RC response-based extrapolation method is thus useful in controlling such thermal systems, e.g., battery system heaters and chillers, liquid-cooled combustion engine thermostat control during a warm-up phase, etc.

Thus, the present method may be used for estimating a steady-state value of an RC response system of a wide range of systems, doing so using a group of three transient RC response amplitude samples. The method in a broader sense may therefore include collecting a group of three discrete RC response samples at a calibrated sampling interval, and estimating a steady-state value using the group of three transient RC response samples. The method then executes a control action via the controller when some or all of the estimated steady-state values are stable to within a predetermined stability threshold, e.g., those of FIGS. 6A-C. As noted above, additional groups of three transient samples may be used with increasing time between samples relative to prior-collected groups, and each discrete sample may belong to multiple groups of three transient RC response amplitude samples. The samples may be filtered using a low-pass filter and/or a data acquisition noise filter, as noted above.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. An electrical system comprising:
   a voltage bus having positive and negative bus rails;
   at least one voltage sensor configured to measure a first voltage between the positive bus rail and electrical ground, and a second voltage between the negative bus rail and the electrical ground;
   a bias resistor connectable to the electrical ground and to the voltage bus via a switch, wherein the switch, when in a closed state, electrically connects the bias resistor to the positive or negative bus rails; and
   a controller configured, responsive to an input signal, to:
      command the switch to close;
      responsive to closing of the switch, measure, in a predetermined sample interval using the at least one voltage sensor, four discrete voltage samples of each of the first voltage and the second voltage;
      group the four discrete voltage samples into first and second sample groups each having first, second, and third discrete voltage samples, wherein the second and third voltage samples of the first sample group are the first and second voltage samples of the second sample group;
      estimate an RC steady-state voltage of each of the first and second voltages using the first and second sample groups, prior to the first and second voltages converging on respective actual steady-state voltage values; and
      execute a control action of the electric system when the steady-state voltage estimate is stable relative to a defined stability threshold, the control action including changing a state of the electric system.

2. The electrical system of claim 1, wherein the controller is further configured to execute another control action when the steady-state voltage estimate is unstable relative to the defined stability threshold, including collecting additional discrete voltage samples of the first voltage and the second voltage at a multiple of the sampling interval and estimate the RC steady-state voltage of each of the first and second voltages using the additional voltage samples.

3. The electrical system of claim 2, wherein the control action includes, responsive to the steady-state voltage estimate being unstable:
   measuring an additional discrete voltage sample of each of the first voltage and the second voltage at a multiple (n) of the predetermined sample interval, wherein $n \geq 1$;
   creating a third sample group containing the additional discrete voltage sample, such that two of the three discrete voltage samples of the second sample group are re-used in the third sample group; and
   estimating the steady-state voltage of each of the first and second voltages using the first, second, and third sample groups, prior to the first and second voltages converging on respective actual steady-state voltage values.

4. The electrical system of claim 1, wherein the voltage bus is a high-voltage bus, and wherein the control action includes initiating a high-voltage loss-of-isolation detection function.

5. The electrical system of claim 4, wherein the control action includes initiating a DC fast-charging operation of the RESS responsive to the high-voltage loss-of-isolation detection function indicating that a high-voltage isolation fault is not present.

6. The electrical system of claim 1, wherein the controller is configured to increase a number of the discrete voltage samples when the estimated steady-state voltage is unstable, and to increase the predetermined sampling interval commensurate with the increase in the number of the discrete voltage samples.

7. The electrical system of claim 1, further comprising a power inverter module connected to the voltage bus and an electric machine connected to the power inverter module, the electric machine being coupled to a driven load.

8. The electrical system of claim 7, wherein the electric machine is a traction motor and the driven load is a set of road wheels of a vehicle.

9. A method for estimating steady-state voltage values in an electrical circuit using an RC voltage response of the electrical circuit, the method comprising
responsive to a trigger signal, connecting a bias resistor to a voltage bus via closing of a switch;
after the switch had closed, measuring at least four discrete voltage samples of a first voltage and a second voltage, using at least one voltage sensor, at a calibrated sampling interval as the first voltage and the second voltage converge on a respective actual steady-state voltage, the first voltage being a voltage between a positive bus rail of the voltage bus and electrical ground, and the second voltage being a voltage between a negative bus rail of the voltage bus and the electrical ground;
estimating steady-state voltage levels of the respective first and second voltages, via the controller, based on the RC voltage response, using the at least four discrete voltage samples, prior to the first and second voltages converging on the respective actual steady-state voltages; and
executing a control action of the electrical system using the estimated steady-state voltage levels when the estimated steady-state voltage levels are sufficiently stable relative to a stability threshold, the control action including changing a state of the electric system.

10. The method of claim 9, wherein the voltage bus is a high-voltage bus, and the control action further includes initiating a loss-of-isolation detection function when the estimated steady-state voltage levels are sufficiently stable relative to the stability threshold.

11. The method of claim 10, wherein the control action includes initiating a DC fast-charging operation of the RESS responsive to the loss-of-isolation function indicating that a voltage isolation fault is not present.

12. The method of claim 9, further comprising:
deriving steady-state voltage estimates of the first and second voltages, via the controller, using a selected group of three discrete voltage samples, the selected group including first, second, and third discrete voltage samples, and choosing the three discrete voltage samples such that:
the second discrete voltage sample is taken a duration of the sampling interval after the first voltage sample is measured; and
the third discrete voltage sample is taken the duration after the second voltage sample;
wherein each respective discrete voltage sample of the selected group contains an instantaneously-sampled discrete voltage sample of the first and/or the second voltage.

13. The method of claim 9, further comprising:
increasing a number of the discrete voltage samples via the controller responsive to the estimated steady-state voltage being unstable; and
increasing the sampling interval commensurate with a level of increase in the number of the discrete voltage samples.

14. The method of claim 9, wherein the electrical system includes a power inverter module connected to the voltage bus and an electric machine connected to the power inverter module, the method further comprising using torque from the electric machine to power a driven load.

15. The method of claim 14, wherein the electric machine is a traction motor and the driven load is a set of road wheels of a vehicle.

16. A method for estimating a steady-state value of an RC response system using a group of three discrete RC response samples, the method comprising:
collecting the group of three discrete RC response samples at a calibrated sampling interval;
estimating the steady-state value using the group of three discrete RC response samples;
executing a first control action via a controller when the estimated steady-state value is stable relative to an allowable stability threshold, including changing a dynamical state of the RC response system; and
executing a second control action via the controller when the estimated steady-state value is unstable relative to the allowable stability threshold, including changing a logical state of the RC response system.

17. The method of claim 16, wherein the steady-state value is a steady-state voltage.

18. The method of claim 16, further comprising filtering the discrete RC response samples using a low-pass filter and/or a data acquisition noise filter.

* * * * *